(12) United States Patent
Seiler et al.

(10) Patent No.: US 9,343,604 B2
(45) Date of Patent: May 17, 2016

(54) PROCESS FOR MONOLITHIC SERIES CONNECTION OF THE PHOTOVOLTAIC CELLS OF A SOLAR MODULE AND A PHOTOVOLTAIC MODULE IMPLEMENTING THIS PROCESS

(71) Applicant: Commissariat A L'Energie Atomique Et Aux Energies Alternatives, Paris (FR)

(72) Inventors: Anne-Laure Seiler, Seyssinet Pariset (FR); Philippe Coronel, Barraux (FR); Joël Dufourcq, Puyoo (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 324 days.

(21) Appl. No.: 13/967,471

(22) Filed: Aug. 15, 2013

(65) Prior Publication Data

US 2014/0014156 A1    Jan. 16, 2014

Related U.S. Application Data (63) Continuation of application No. PCT/FR2012/050348, filed on Feb. 17, 2012.

(30) Foreign Application Priority Data

Mar. 1, 2011 (FR) ..................... 11 51652

(51) Int. Cl.
| | |
|---|---|
| H01L 31/042 | (2014.01) |
| H01L 31/05 | (2014.01) |
| H01L 31/0463 | (2014.01) |
| H01L 31/0465 | (2014.01) |

(52) U.S. Cl.
CPC ........ H01L 31/0504 (2013.01); H01L 31/0463 (2014.12); H01L 31/0465 (2014.12); *Y02E 10/50* (2013.01)

(58) Field of Classification Search
USPC ............................................. 438/57, 561, 700
See application file for complete search history.

(56) References Cited

U.S. PATENT DOCUMENTS 8,563,846 B2 * 10/2013 Park ..................... H01L 31/18
136/244

(Continued)

FOREIGN PATENT DOCUMENTS

WO    2009/007375 A2    1/2009

OTHER PUBLICATIONS

International Search Report dated Mar. 6, 2013.

*Primary Examiner* — Timor Karimy
(74) *Attorney, Agent, or Firm* — Burr & Brown, PLLC (57) ABSTRACT

A method for manufacturing two series-connected photovoltaic cells includes: forming an insulating substrate; forming a stack including; a first conductive layer formed on the substrate; a semiconductor layer comprising a first absorption layer and a second semiconductor layer forming a junction with the first absorption layer; and a second transparent conductive layer, formed on the absorption layer; forming an area dividing the stack into two cells series-connected by an electric path. The forming of said path comprises: forming a first trench all the way to the substrate; forming a second trench all the way to the first conductive layer; and depositing a conductive solution on the first trench and at last a portion of the second trench, so that the solution does not penetrate into the first trench all the way to the first conductive layer and penetrates into the second trench all the way to the first conductive layer.

11 Claims, 8 Drawing Sheets

(56) References Cited

U.S. PATENT DOCUMENTS 8,809,109 B2 * 8/2014 Dounas ............... H01L 31/0463
                                                          438/68

2010/0015752 A1  1/2010  Brabec et al.
2010/0170558 A1  7/2010  Stein

* cited by examiner

PROCESS FOR MONOLITHIC SERIES CONNECTION OF THE PHOTOVOLTAIC CELLS OF A SOLAR MODULE AND A PHOTOVOLTAIC MODULE IMPLEMENTING THIS PROCESS

FIELD OF THE INVENTION

The invention relates to the field of photovoltaic cells, and more specifically to a method for manufacturing an area of monolithic series connection of photovoltaic cells.

BACKGROUND OF THE INVENTION

As known per se, photovoltaic modules or "solar" modules, comprise one or several series arrangements of photovoltaic cells, each formed of a semiconductor absorption area interposed between a first conductive electrode and a second conductive electrode transparent to light, forming the surface on which the cell is illuminated by solar radiation. The first electrode is commonly called "back" electrode and the second electrode is commonly called "front" electrode.

For reasons of cost and simplicity of manufacturing, one of the technologies used, called "thin layer" technology, comprises collectively manufacturing the cells by depositing on an insulating substrate a stack formed, in the following order, of:

a first electrically-conductive layer,
a first semiconductor absorption layer,
a second semiconductor layer forming a heterojunction with the first semiconductor layer,
a second electrically-conductive layer transparent to light.

The photovoltaic cells are then individualized by the forming of trenches in the stack.

Further, the series connection of two adjacent photovoltaic cells is preferably performed by manufacturing a connection area in the stack, which defines both the individualization of the two cells and connects a front electrode of one of the cells to the back electrode of the other cell while only using the layers forming the stack.

This type of so-called "monolithic" electric connection has the advantage of not having to mechanically separate the cells to transfer them into a connection package performing their series connection, and also avoids the use of wire connections and of weldings. Further, it also provides a gain in terms of manufacturing cost and of compactness.

A method for manufacturing a photovoltaic module 10 of the state of the art is described in relation with FIGS. 1 to 5.

Figure 1:
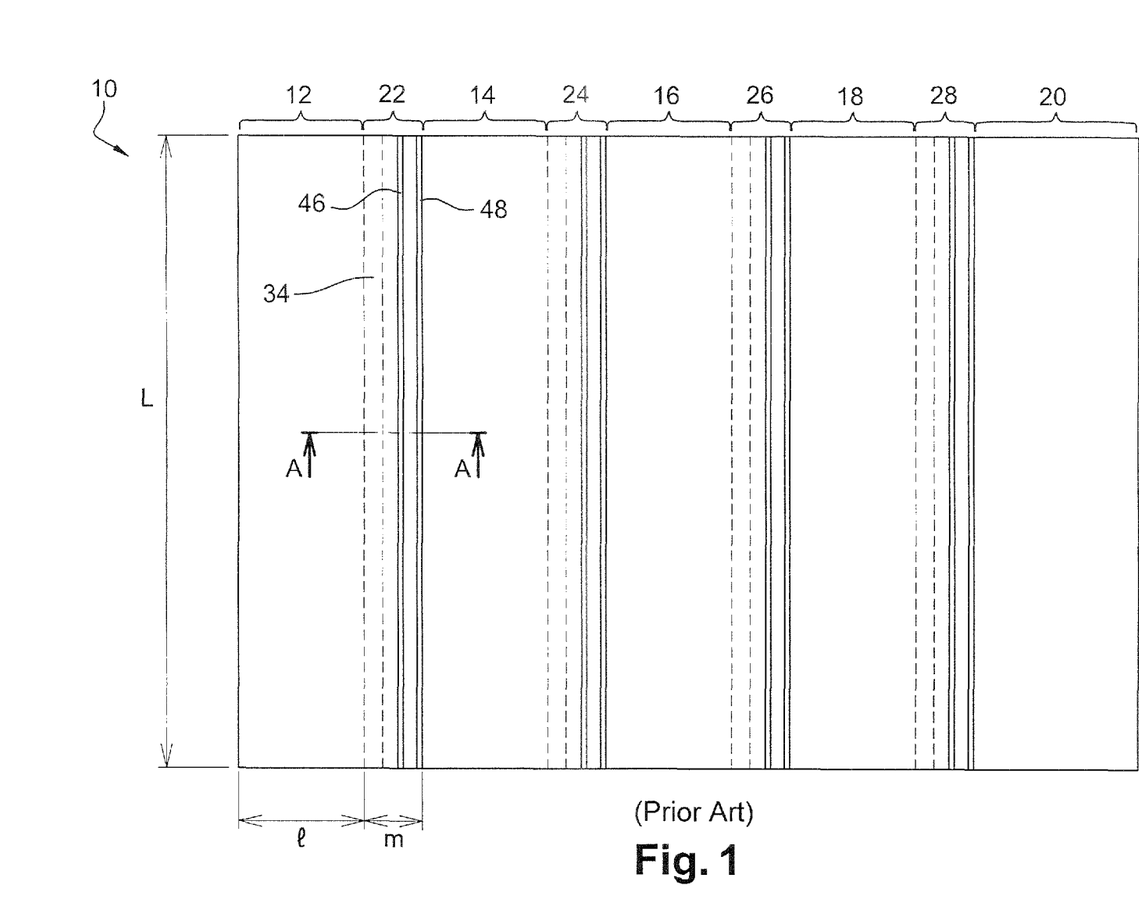
FIG. 1 is a simplified view of the front surface of a solar module according to the state of the art, such as described in the preamble.

FIG. 1 is a simplified view of the front surface of a module 10 comprising five photovoltaic cells 12, 14, 16, 18, 20 series-connected by monolithic connection areas 22, 24, 26, 28.

FIGS. 2 to 5 are simplified cross-section views along plane A-A of FIG. 1 illustrating the method for manufacturing module 10.

FIG. 1 is not to scale, the width of monolithic connection areas 22, 24, 26, 28 having been exaggerated to make them more visible. Especially, length L of photovoltaic cells 12, 14, 16, 18, 20 usually ranges between 1 millimeter and some ten centimeters, said length L being even likely to exceed one meter, width l of photovoltaic cells 12, 14, 16, 18, 20 usually is on the order of one centimeter, while width m of monolithic connection areas 22, 24, 26, 28 usually ranges between 100 and 300 micrometers.

The method for manufacturing module 10 starts with the deposition of a conductive layer 30, usually a metal layer made of a hard metal, preferably molybdenum, on an insulating substrate 32, usually made of glass, of plastic, or of metal covered with an insulating layer.

Figure 2:
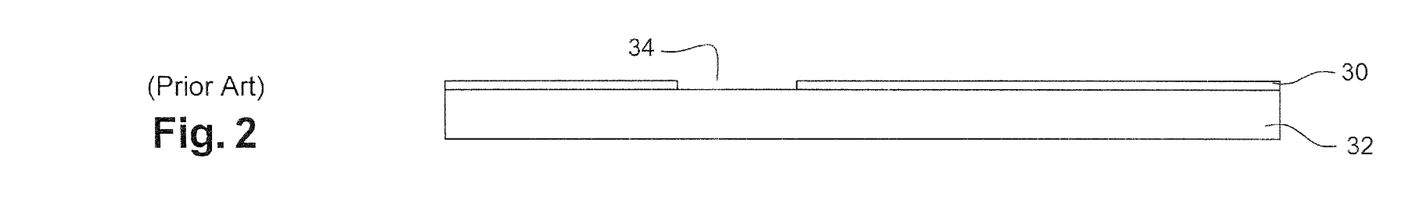
FIGS. 2 to 5 are cross-section views along plane A-A of FIG. 1 illustrating a method for manufacturing the module of FIG. 1, such as described in the preamble.

For each monolithic connection area, an etching 34 is performed in metal layer 30 all along its length, for example, by means of a laser UV or IR laser delivering pulses lasting from a few picoseconds to a few nanoseconds (FIG. 2).

A semiconductor layer 36 having a thickness of a few micrometers, for example, 2 micrometers, is then deposited on metal layer 30 and etching 34.

Semiconductor layer 36 is usually made in the form of a bilayer having a first lower layer 38 and a second upper layer 40. Lower layer 38 performs the function of absorbing a predetermined electromagnetic radiation and is made of a polycrystalline alloy comprising at least copper, indium, gallium, and selenium, more commonly known as a "CIGS" alloy. Upper layer 40 forms a heterojunction with lower semiconductor layer 38, and is for example formed of a cadmium sulfide (CdS) layer having a thickness of a few tens of nanometers, for example, 60 nanometers.

Figure 3:
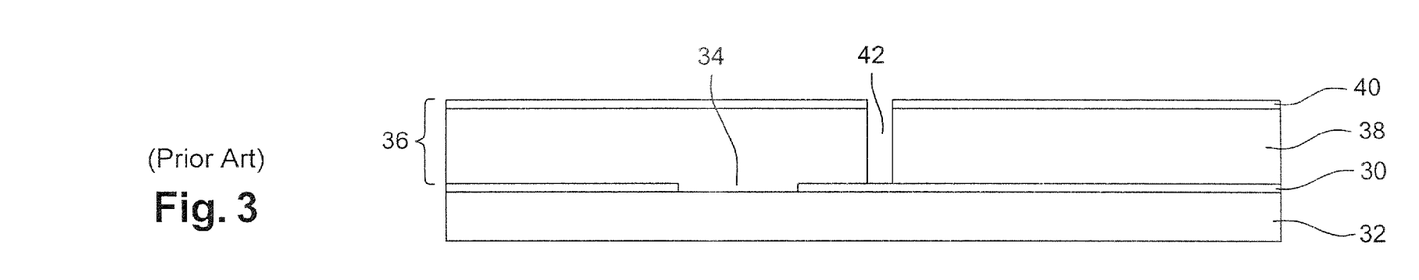

A first trench 42 is then etched in the stack thus formed, along the entire length L thereof, all the way to first metal layer 30 (FIG. 3).

A conductive layer 44 transparent to light is then formed on semiconductor layer 36. Layer 44 for example comprises an electrically-conductive transparent layer 48 having a thickness of some hundred nanometers, for example, 500 nanometers, especially aluminum-doped ZnO (ZnOAl) (FIG. 3). Its function is improved by the presence of an optional layer 46, especially a very thin zinc oxide (ZnO) layer, typically having a thickness of a few tens of nanometers, for example, 50 nanometers, rather resistive, which enables to avoid the forming of short-circuits with semiconductor layer 36 when the surface state of layer 38 is not very good.

Figure 4:
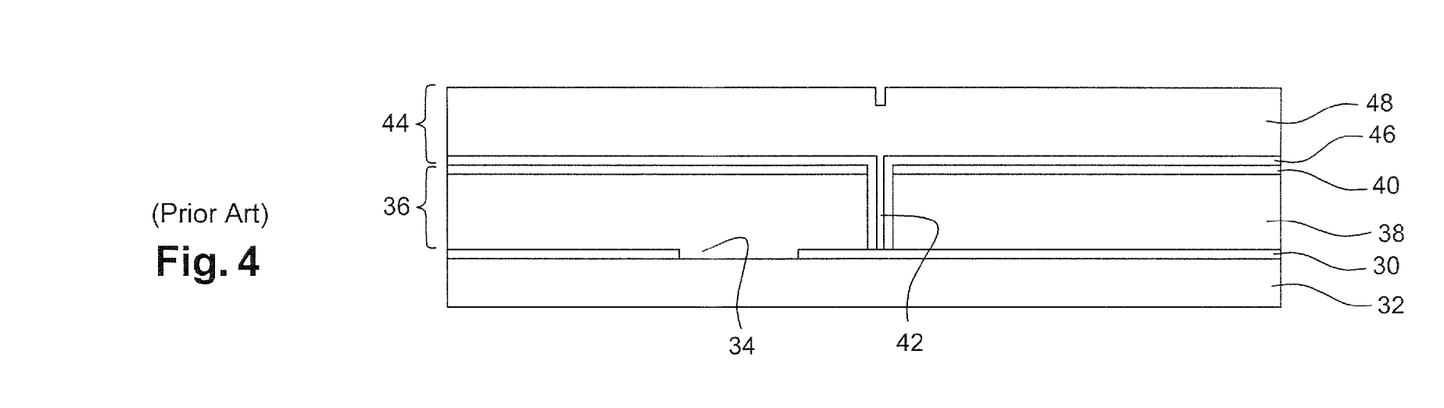

The material forming upper layer 48 thus fills trench 42 (FIG. 4). It should be noted that semiconductor layer 44 may also be formed of upper layer 48 only. The function of layer 48 is however improved by the presence of very thin and relatively resistive optional layer 46, which enables to avoid short-circuits with junction 36 when the surface state of lower semiconductor layer 38 is not good enough.

The method then carries on with the forming, for each monolithic connection area 22, 24, 26, 28, of a second trench 50, parallel to first trench 42, in the thickness of the stack thus formed, all along length L thereof and all the way to metal layer 30. In the example of the previously-described materials, layers 36 and 44 are friable and metal layer 30 has a greater hardness than layers 36, 44.

Figure 5:
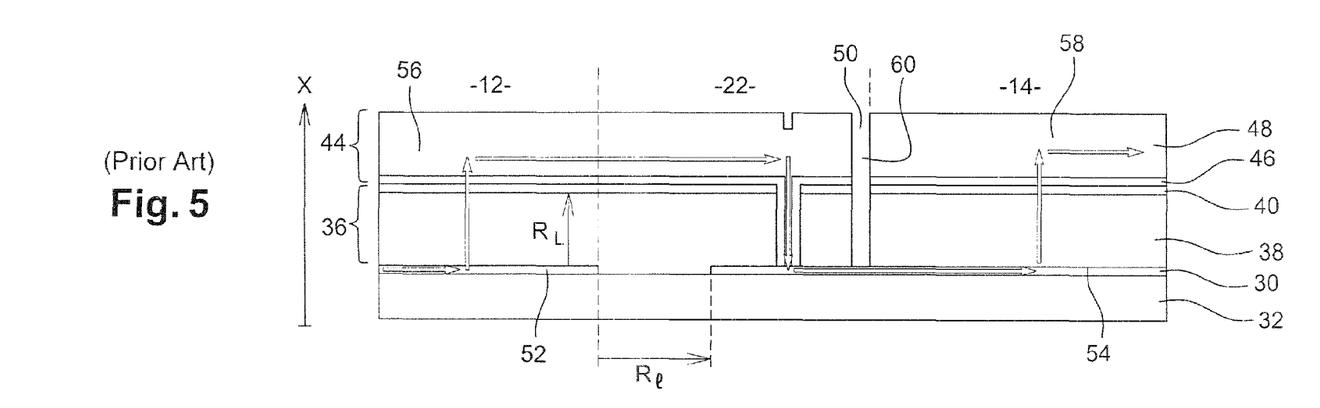

Second trench 50, like first trench 42, is usually made in a single step by scratching the stack with a stylus (FIG. 5).

Thus, the manufacturing of a monolithic connection area, area 22 in the example illustrated in FIGS. 2 to 5, results in delimiting two adjacent photovoltaic cells 12 and 14.

Especially, etching 34 separates back electrodes 52, 54 of cells 12 and 14, the electric insulation between the two back electrodes thus formed being performed by the semiconductor material of absorbing layer 38 separating them.

First and second trenches 42, 50 are formed above the same back electrode 54. Second trench 50, non adjacent to etching 34, separates front electrodes 56, 58 of cells 12, 14, the electric insulation between the two front electrodes 56, 58 thus formed being achieved by medium 60 filling second trench 50, usually air.

First trench 42 filled with the conductive material of layer 48, has the function of defining an electric path. Thus, connection area 22 defines an electric path illustrated by the arrows of FIG. 5, series-connecting these cells, that is, electrically connecting front electrode 56 of cell 12 to back electrode 54 of cell 14.

In the following, term "transversal" relates to the stack direction, illustrated by arrow X in FIG. 5, and term "lateral" relates to a direction perpendicular to the stack direction.

It should however be noted that the electric insulation between back electrodes 52, 54 depends on the value of total lateral electric resistance $R_l$ of the semiconductor material area filling etching 34, and more specifically on its ratio to total transversal electric resistance $R_L$ of semiconductor layer 38.

Indeed, the electric current preferably flows along the path of least electric resistance, whereby it should be ascertained that lateral resistance $R_l$ is much greater than transversal resistance $R_L$.

To obtain this result, a very large width of trench 34 should be provided. Thus, for example, even though polycrystalline CIGS has a lateral linear electric resistance much greater than its transversal linear electric resistance due to the crystal growth direction on deposition of layer 38, it is necessary to provide a trench 34 having a width of at least 100 micrometers. Thereby, the width of the monolithic connection area is largely dictated by the width of etching 34. Thus, a non-negligible surface area is lost for photon absorption. Further, even though the width of etching 34 guarantees a minimum electric insulation between the back electrodes of two adjacent photovoltaic cells, such an electric insulation however still remains too low, so that leakage currents between two back electrodes can be observed, which adversely affects the general performance of the solar module. This defect is all the more aggravated as components are miniaturized.

Thus, prior art monolithic connection areas provide a significant gain in terms of cost, compactness, and easy connection, but are intrinsically limited as to the electric insulation of the back electrodes of photovoltaic cells.

BRIEF DESCRIPTION OF THE INVENTION

The present invention aims at providing monolithic connection areas for a photovoltaic module, as well as a method for manufacturing the same, which substantially increase the electric insulation between the back electrodes of the photovoltaic cells forming the module.

For this purpose, the invention relates to a method for manufacturing a photovoltaic module comprising at least two series-connected adjacent photovoltaic cells, comprising:
 forming an insulating substrate;
 forming a stack comprising:
  a first electrically-conductive layer formed on the insulating substrate;
  a semiconductor layer comprising a first semiconductor layer for absorbing a predetermined electromagnetic radiation, formed on the first conductive layer, and a second semiconductor layer forming a junction with the first semiconductor absorption layer and formed thereon; and
  a second electrically-conductive layer at least partly transparent to said radiation, formed on the semiconductor layer;
 forming at least one connection area dividing the stack into a first and a second adjacent photovoltaic cells only electrically connected by an electric path between a portion of the first conductive layer of the first cell and a portion of the second conductive layer of the second cell.

According to the invention, the forming of said electric path comprises:

forming a first trench in the stack from the second conductive layer to the substrate;
 forming a second trench, separate from the first trench, from the second conductive layer to the first conductive layer; and
 depositing a conductive solution on an area of the second semiconductor layer comprising the first trench and at least a portion of the second trench located on the side of the first trench, the geometry of the trenches, the thickness of the second conductive layer, and the quantity and the properties of the conductive solution on deposition thereof being selected so that the conductive solution does not penetrate into the first trench all the way to the first conductive layer and penetrates into the second trench all the way to the first conductive layer.

Solution here means a liquid, which thus has an ability to deform under the effect of its own weight and of capillarity phenomena. As an example illustrating this definition, an ink made of a volatile solvent with conductive particles, especially metallic, in suspension, may for example be mentioned. As an additional example, opaque pastes such as silver inks or carbon-platinum inks, and transparent pastes such as indium tin oxide or ITO inks, may also be mentioned.

In other words, the back electrodes of adjacent photovoltaic cells, according to the invention, which, instead of being separated by the semiconductor material of the absorption layer, are separated by a cavity filled with the gas surrounding the module on manufacturing thereof, that is, usually, air. Now, air has an electric resistance much greater than the electric resistance of any semiconductor, including the lateral electric resistance of polycrystalline semiconductor materials such as polycrystalline CIGS alloys. A substantial gain in electric insulation between the back electrodes of adjacent photovoltaic cells is thus obtained.

The method according to the invention, apart from its primary purpose of manufacturing a cavity filled with air between back electrodes, also has the advantage of keeping the simplest possible stack manufacturing, that is, a simple successive forming of layers.

It should indeed be understood that when a cavity is formed too early, for example, once the absorption semiconductor layer is completed, it is necessary to provide measures for protecting the formed cavity on deposition of the next layers. Otherwise, the cavity would be filled with the material constitutive of said layers, and especially with the conductive material of the second conductive layer, which would result in a short-circuit between the front and back electrodes of a same cell. Such measures thus amount to providing a mask for protecting the cavity for each step of deposition of a new layer, which significantly increases the number of manufacturing steps, and thus the final cost of the module.

According to the method of the invention, only once the stack is completed is the cavity formed, especially by the use of a simple etching through the stack thickness. The electric connection between the front electrode of a cell and the back electrode of another adjacent cell is then simply performed by depositing a judiciously-selected conductive solution which does not fill the cavity and avoids the short-circuit thereof. It should thus be easily understood that the manufacturing method of the invention, by this selection of the time of forming of the cavity combined with the selection of an appropriate conductive solution, is very simple to implement and requires a very small number of steps.

Once this has been established, it should also be easily understood that there is a great number of possibilities to obtain the result of the "non-penetration" of the conductive solution into the first trench. Indeed, the depth of penetration of a solution into a trench especially depends on:

the trench width, and more generally on its geometry;

the viscosity of the solution and capillarity phenomena which involve the surface tension of the solution, the surface energies, and the chemical affinities of the materials used;

and by a lesser extent, the volume of solution deposited on the trench, that is, the weight of the solution column above the trench.

This is further balanced by the fact that the solution can penetrate into the first trench, the important point being for the solution not to reach the semiconductor layer to avoid a short-circuit. Thus, the thickness of the second conductive layer may also be involved in the selection of the previous parameters.

Similarly, all this should be balanced by the method used to deposit the solution. For example, with an inkjet-type deposition, it is possible to deposit variable quantities of solution, and especially less solution on the first trench and more solution on the second trench.

According to an embodiment of the invention, the forming of the connection area comprises forming a third trench in the stack, only adjacent to the second trench and distinct therefrom, from the second conductive layer to the first conductive layer. This third trench enables to separate and to insulate the front electrodes of the photovoltaic cells.

According to another embodiment of the invention, the width of the second trench is selected so that the conductive solution is not in contact with the portion of the second semiconductor layer of the second cell. In other words, the separation and the insulation of the front electrodes are achieved by a sufficient thickness of the second trench and by the fact that the solution does not form a bridge between opposite edges of the second trench.

According to an embodiment of the invention, the widths of the first and second trenches are selected according to the viscosity of the conductive solution. It is indeed possible to obtain the desired result by parameterizing the viscosity of the solution and the width of the trenches.

According to an embodiment of the invention, the method comprises a step of texturing the walls of the first trench with three-dimensional patterns. As a variation, the method comprises a step of forming pads on a surface of the substrate exposed by the forming of the first trench, the height of the pads being substantially equal to that of the first trench. Especially, the minimum lateral distance without matter in the first trench is selected according to the viscosity of the conductive solution. More specifically, the method comprises forming a periodic three-dimensional pattern comprising raised portions and recessed portions on a first wall of the first trench, and forming the same periodic pattern on a second wall of the first trench, opposite to the first wall, the pattern of the second wall being shifted with respect to the pattern of the first wall to have the raised portions of the pattern of the first wall face the recessed portions of the pattern of the second wall.

Thereby, the internal surface of the first trench coming into contact with the solution is increased, which limits the penetration thereof. A solution having a lower viscosity than that which would be necessary in the absence of the texturing and/or of the pads may thus for example be selected. Similarly, it is possible to select a wider first trench, should the method and/or the application require it.

According to an embodiment of the invention, the conductive solution is deposited by screen printing, heliography, flexography, inkjet or sputtering.

The invention also relates to a photovoltaic module comprising at least two photovoltaic cells, each comprising a semiconductor light absorption area interposed between a back conductive electrode and a front conductive electrode at least partly transparent to light, the cells being series-connected by means of a monolithic connection area comprising a trench separating the back electrodes.

More specifically, the invention also relates to a photovoltaic module comprising at least two series-connected adjacent photovoltaic cells, comprising:

an insulating substrate;

a stack comprising:

a first electrically-conductive layer formed on the insulating substrate;

a semiconductor layer comprising a first semiconductor layer for absorbing a predetermined electromagnetic radiation, formed on the first conductive layer, and a second semiconductor layer forming a junction with the first semiconductor absorption layer and formed thereon; and a second electrically-conductive layer at least partly transparent to said radiation, formed on the semiconductor layer; and at least one connection area dividing the stack into a first and a second electrically-adjacent photovoltaic cells only connected by an electric path between a portion of the first conductive layer of the first cell and a portion of the second conductive layer of the second cell.

According to the invention, said electric path comprises:

a first trench formed in the stack from the second conductive layer to the substrate and filled with gas;

an electrically-conductive deposit layer formed on an area of the second semiconductor layer comprising the first trench and at least a portion of the second trench located on the side of the first trench, without for said deposit to penetrate into the first trench all the way to the first conductive layer; and a second trench, separate from the first trench, formed from the second conductive layer to the first conductive layer, the second trench being filled with an electrically-conductive material all the way to the second conductive layer.

The module is preferably manufactured according to the previously-mentioned method.

BRIEF DESCRIPTION OF THE DRAWINGS

The present invention will be better understood on reading of the following description provided as an example only in relation with the accompanying drawings, where the same reference numerals designate the same or similar elements, and among which:

FIGS. 12A-12I are simplified top views of an electric insulation trench between two back electrodes of photovoltaic cells, having their edges provided with three-dimensional patterns according to several variations; and FIGS. 13A-13E are simplified top views of an electric insulation trench between two back electrodes of photovoltaic cells, having pads formed therein according to several variations.

DETAILED DESCRIPTION OF THE INVENTION

Figure 6:
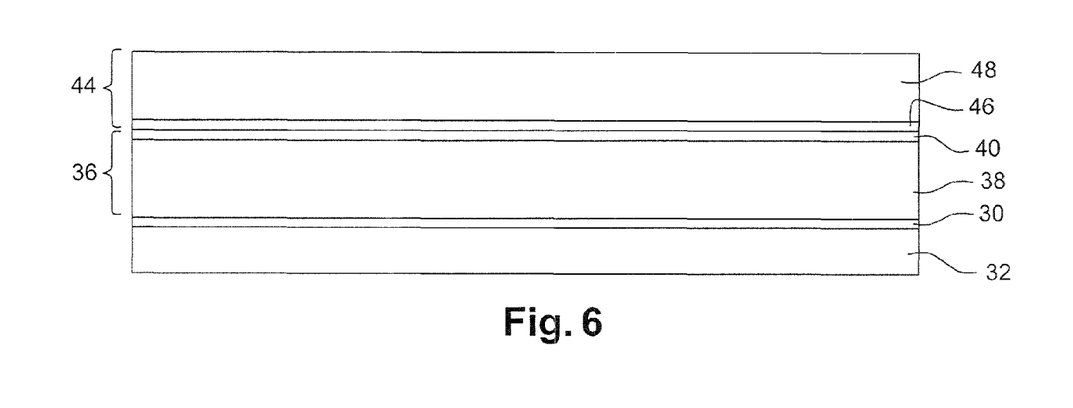
FIGS. 6 to 8 are simplified cross-section views illustrating a method for manufacturing a photovoltaic module according to a first embodiment of the invention.

A method for manufacturing a photovoltaic module according to a first embodiment of the invention will now be described in relation with FIGS. 6 to 8.

The method starts (FIG. 6) with the forming of an insulating substrate 32 and the forming of a stack comprising:
- a first electrically-conductive layer 30 formed on insulating substrate 32;
- a semiconductor layer 36, formed on conductive layer 30; and
- a second electrically-conductive layer 44 at least partly transparent to said radiation, formed on semiconductor absorption layer 36.

The layers forming this stack for example have identical dimensions and are made of the same materials as the layers of the photovoltaic module of the state of the art described in relation with FIGS. 1 to 5. Especially, semiconductor layer 36 is a bilayer comprising a lower layer 38 for absorbing a predetermined electromagnetic radiation and an upper junction layer 40. Second conductive layer 44 may be a bilayer formed of an optional lower layer 46 and of an upper layer 48, as in the previously-described state of the art.

Once the stack has been formed, the method carries on with the forming of monolithic connection areas individualizing the photovoltaic cells while series-connecting them.

Figure 7:
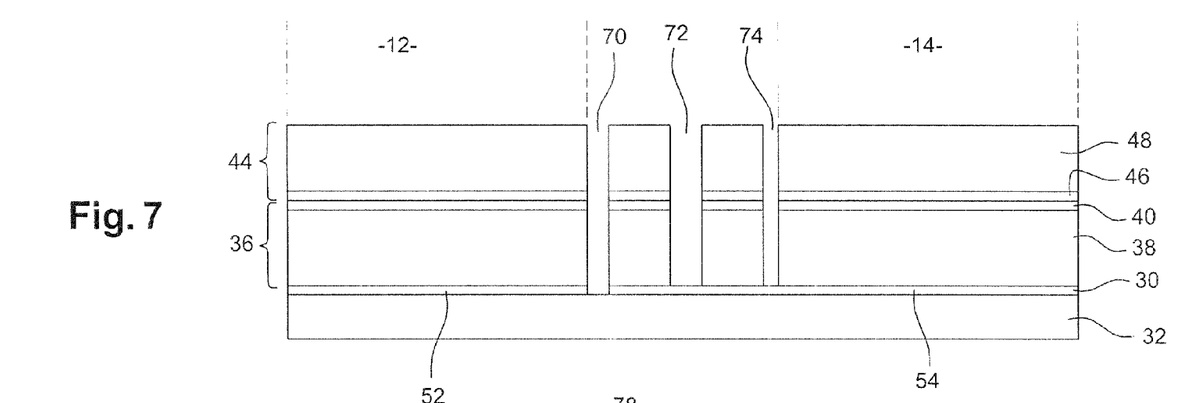

More specifically, for each monolithic connection area, three trenches 70, 72, 74 of different width are formed in parallel along length L of the stack (FIG. 7).

First trench 70 is for example formed by means of a laser etching through the stack thickness all the way to substrate 32. Second and third trenches 72, 74 are formed through the stack thickness all the way to conductive layer 30, for example, by means of a scratch made with a stylus or by laser or by chemical etching.

First trench 70 thus separates layer 30 in two portions, respectively forming back electrodes 52, 54 of a first and of a second adjacent photovoltaic cells 12, 14, back electrodes 52, 54 being insulated from each other by trench 70, which forms a cavity filled with air. Third trench 74, non adjacent to first trench 70, separates front electrodes 56, 58 from cells 12, 14, the electric insulation between the two back electrodes 52, 54 being performed by the air filling third trench 74.

A conductive solution 76 is then deposited on an area 78 of second conductive layer 44, area 78 comprising first and second trenches 70, 72, the deposition being for example performed by screen printing or by sputtering. Solution 76 is transparent or semi-transparent and is for example an indium tin oxide (or "ITO") solution, a ZnOAl solution, an indium zinc oxide (or "IZO") solution, a polymer solution with carbon nanotubes, or a PEDOT (polyethylenedioxythiophene) polymer solution. As a variation, the solution may be opaque, for example, a platinum carbon (CPt) ink or a silver ink.

Solution 76 has the function of electrically connecting front electrode 56 of cell 12 to back electrode 54 of cell 14. For this purpose, solution 76 thus covers first trench 70 and penetrates into second trench 72, filling it up to a sufficiently high level to be in contact with second conductive layer 44.

However, to avoid a short-circuit between front electrode 54 and semiconductor absorption layer 38 of cell 74, or more adversely still with back electrode 52, solution 76 does not penetrate into first trench 70 and may form only a drop 77 inside of trench 70, or solution 76 penetrates into first trench 70 but at such a depth that it does not reach semiconductor absorption layer 38.

Conductive solution 76 is then solidified, for example, by evaporation of a solvent if it is a solvent-containing solution, or by thermosetting if it is a thermosetting material.

Figure 8:
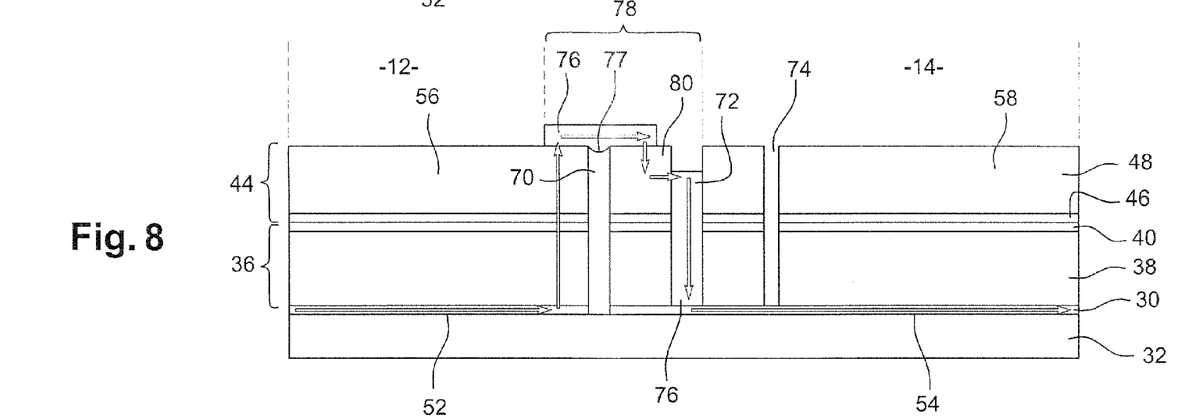

Photovoltaic cells 12 and 14 are thus series-connected by the electric path illustrated by the arrows of FIG. 8, which connects back electrode 52 of cell 12 to the front electrode of cell 14.

FIG. 8 illustrates a variation where the deposition of solution 76 has caused a rupture 80 between, on the one hand, the solidified solution deposited on trench 70 and, on the other hand, the solidified solution deposited in second trench 72. Rupture area 80, shown with exaggerated dimensions herein, may for example be due to a limited amount of solution deposited around second trench 72 and/or to the solidification process.

Figure 9:
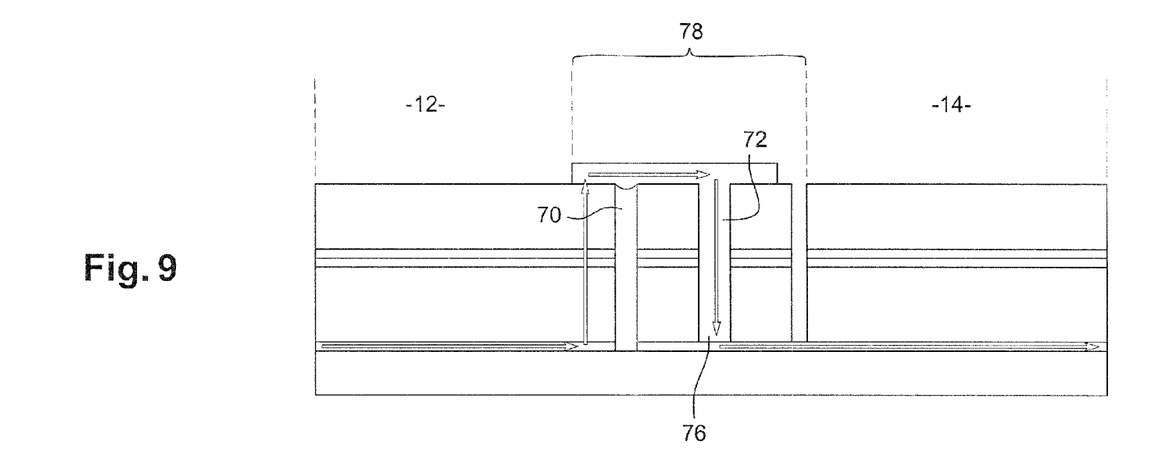
FIG. 9 is a simplified cross-section view of a variation of the first embodiment according to the invention.

FIG. 9 illustrates a variation where such a rupture is absent. For example, the solution volume deposited in second trench 72 is larger than what it previously was, so that the solution totally fills the second trench and forms, once set, a continuous area. In this variation, the electric path differs from that of FIG. 8 and only comprises conductive materials.

In the embodiments just described, the front electrodes of two adjacent cells 12, 14 are separated by means of third trench 74.

Figure 10:
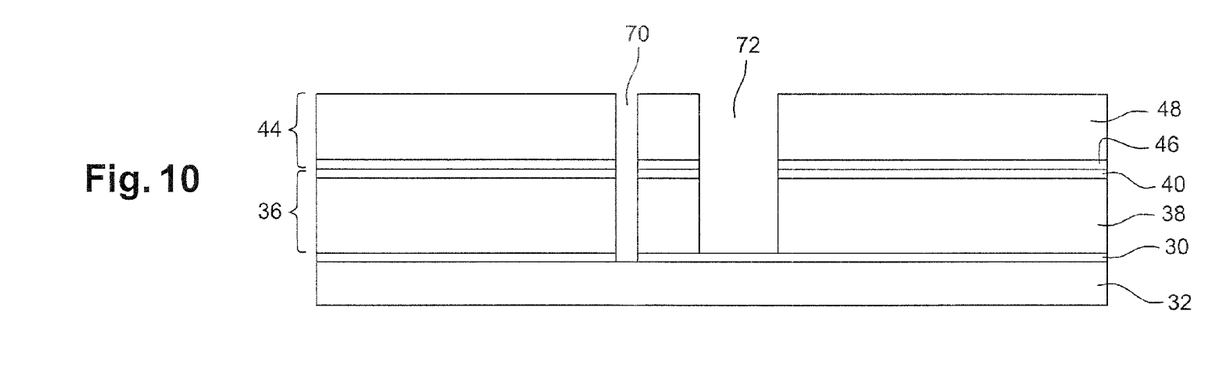
FIGS. 10 and 11 are simplified cross-section views illustrating a method for manufacturing a photovoltaic module according to a second embodiment of the invention.
Figure 11:
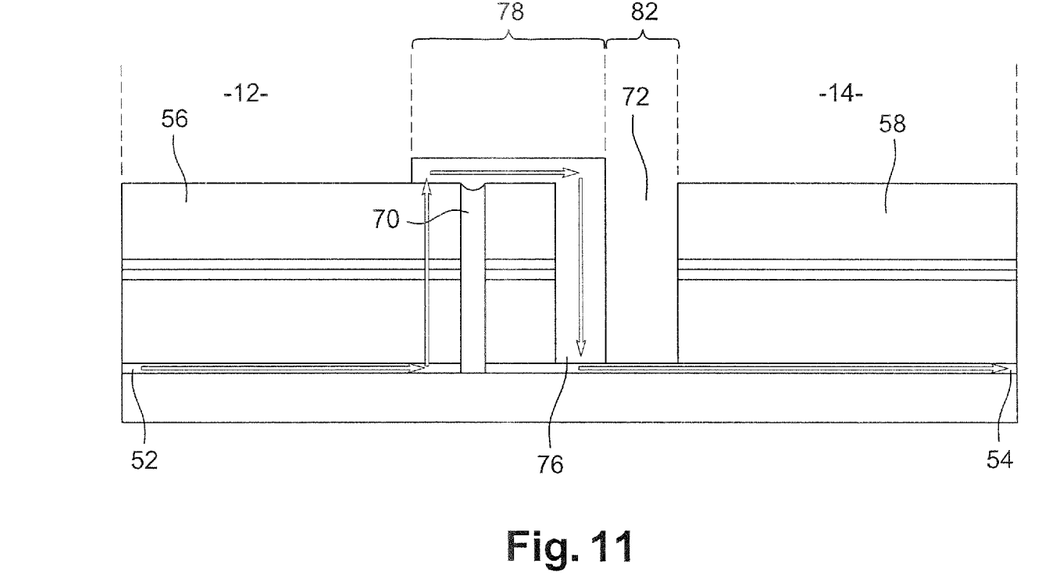

A method for manufacturing a photovoltaic module according to a second embodiment of the invention is described in relation with FIGS. 10 and 11. According to this second embodiment, the individualization and the connection of two adjacent cells are performed by means of two trenches only. More specifically, the method starts with the forming of the stack of layers 30, 32, 36, 44 as described in relation with FIG. 6, and carries on with the forming of first and second trenches 70 and 72 as described in relation with FIG. 7 (FIG. 10).

A conductive solution 76 is then deposited on an area 78 of second conductive layer 44, area 78 comprising first and second trenches 70, 72, the deposition being for example performed by ink jet, by sputtering, or by screen printing.

Conversely to the previous embodiments, conductive solution 76 and/or the width of second trench 72 are selected so that solution 76 does not reach the edge of second trench 72 corresponding to second cell 14 (FIG. 11). There thus exists, in second trench 72, a space 82 filled with air, which isolates front electrodes 56, 58 of adjacent cells 12, 14. The electric path connecting back electrode 52 of cell 12 to front electrode 58 of the second cell is illustrated by the arrows. In the example illustrated in FIGS. 10 and 11, solution 76 forms a continuous area but may, as a variation, comprise a rupture similar to that of FIG. 8.

The lack of penetration or the limited penetration of solution 76 into first trench 70 is obtained by parameterizing the width of the first trench, the viscosity of the deposited solution, the thickness of second conductive layer 44, the accuracy of the deposition method, and the volume deposited on first trench 70.

Usually, semiconductor absorption layer 38 amounts to between one quarter and one third of the total height of first trench 70. By ascertaining that solution 76 penetrates no further than one quarter of trench 70, any risk of short-circuit is thus avoided since there will be no contact between solution 76 and semiconductor absorption layer 38, let alone with conductive layer 30.

It has especially been observed that for a trench 70 having a width greater than 15 micrometers, a viscosity of solution 76 greater than 3.2 cPoises (mPa·s) provides the desired lack of penetration or limited penetration. However, for a lower width of trench 70, for example, for miniaturization purposes, a solution 76 with a lower viscosity may be used.

For example, a CPt ink having a viscosity of 3.2 cPoises, and thus lower than the maximum limit of 50 cPoises usually required for a sputtering, deposited by sputtering across a 10-micrometer thickness with a 48-kHz ultrasound frequency, and a width of the first trench smaller than 15 micrometers, enable to keep the CPt ink at the surface with a low penetration into trench 70.

It is generally possible to select the trench width once the other parameters of the deposition (viscosity of the solution, deposited solution volume, thickness of the second conductive layer, type of deposition method used) have been determined.

It is further possible to use deposition methods which enable to deposit different volumes of solution on the first and second trenches, which provides a greater freedom of choice for the solution, and especially its viscosity.

It is further also possible to set the penetration of the solution into the first trench by selecting the type of solidification of the solution. For example, by selecting a thermosetting solution, it is possible to stop the progress of this solution in the first trench by heating it. Similarly, by selecting a crosslinkable polymer solution, it is possible to stop its progress by submitting it to an appropriate radiation.

A first trench 70 with planar edges has been described. To limit the penetration of a solution into first trench 70, the transversal walls thereof comprise, at least in the upper portion of trench 70, a surface texturing to form three-dimensional patterns, such as for example illustrated in the top view of FIG. 12A.

Figure 12A:
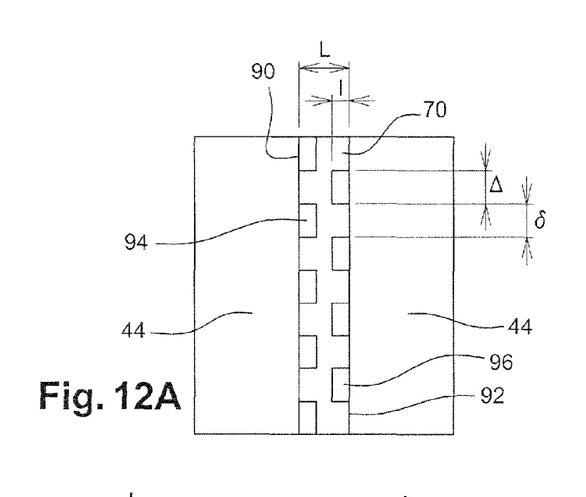
Figure 12B:
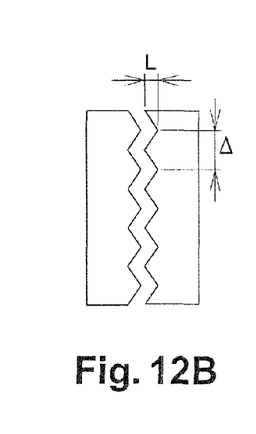
Figure 12C:
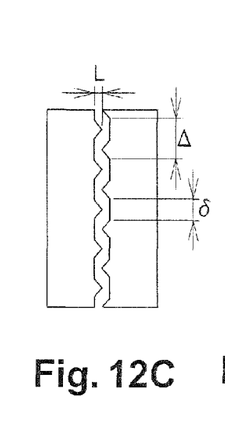
Figure 12D:
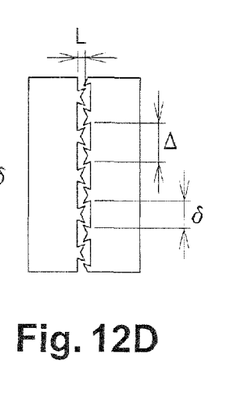
Figure 12E:
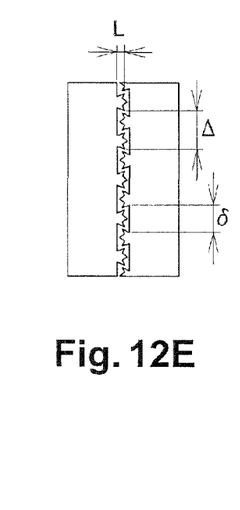
Figure 12F:
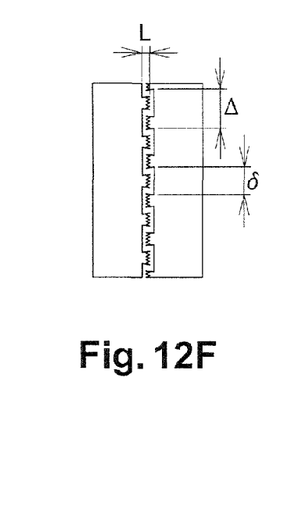
Figures 12G, 12H:
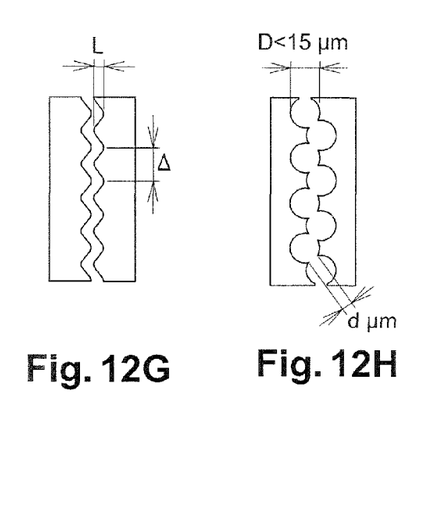
Figure 12I:
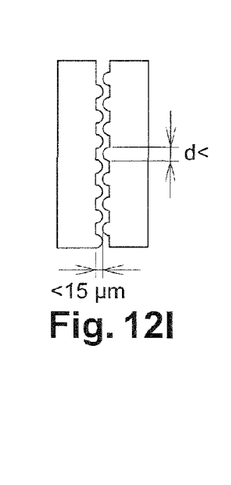
Figure 13A:
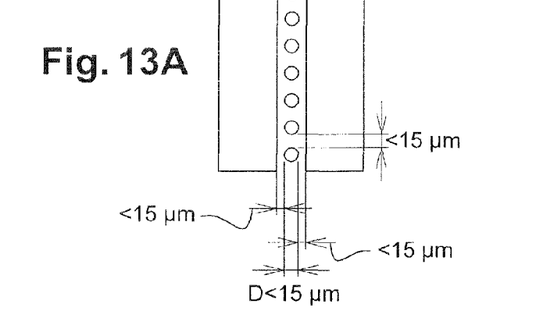
Figure 13B:
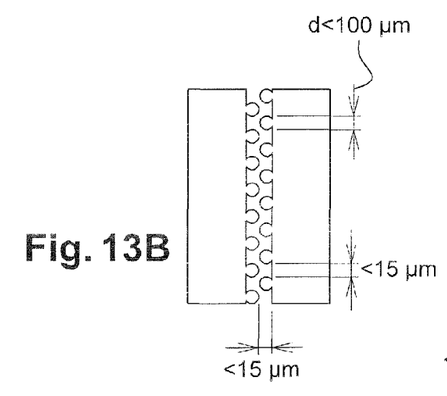
Figure 13C:
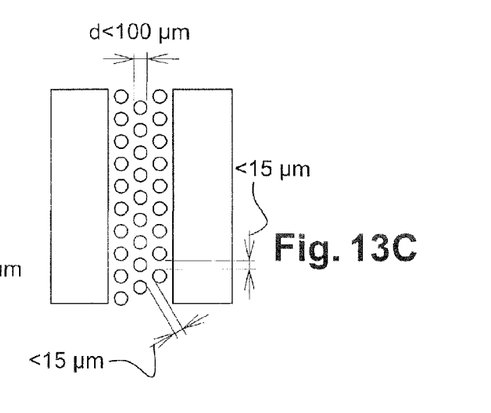
Figure 13D:
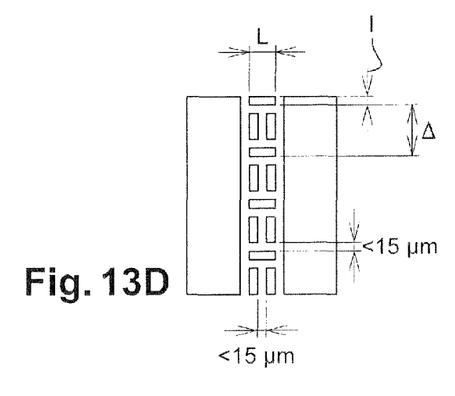
Figure 13E:
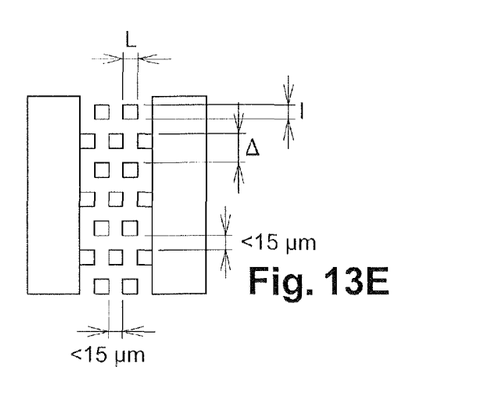

In this drawing, each of walls 90, 92 of first trench 70 comprises a periodic network of patterns 94, 96 of rectangular cross-section, network 94 of a wall 90 being shifted with respect to network 96 of the other wall 92 so that a pattern of a wall is arranged in front of a recessed portion of the other wall. The pattern geometry, defined by parameters L, l, Δ, δ illustrated in FIG. 12A, is further selected so that the minimum lateral distance between any point of the first wall and any point of the second wall is smaller than the distance necessary to avoid the penetration of the solution into trench 70, for example, smaller than 15 micrometers in the previous example of the deposition of a CPt ink such as previously described. The patterns thus enable, for equal trench widths, to increase the surface area in contact with the solution, and thus to select a less viscous solution should the application require it, for example, due to constraints relative to the deposition method or to the solution manufacturing.

Patterns of rectangular cross-section have been described. However, as illustrated in FIGS. 12B to 12I, other patterns are possible on the walls of the first trench, the pattern geometry being selected to obtain the minimum lateral distance which avoids or limits the penetration of the solution, between any point of the first wall and any point of the second wall.

Similarly, as illustrated in FIGS. 13A to 13E, it is also possible to provide, as a complement to the wall patterns or instead of them, pads formed in the bottom of the first trench all the way to the upper edge thereof. The geometry of such pads is also selected to obtain the minimum lateral distance with no matter desired in the first trench.

According to the present invention, one thus obtains:
an increased electric insulation between the back electrodes of adjacent photovoltaic cells, which results in a performance gain of the module.
an easy-to-implement manufacturing, which results in a lower cost.

The invention claimed is:
1. A method for manufacturing a photovoltaic module comprising at least two series-connected adjacent photovoltaic cells, said method comprising:
   forming an insulating substrate;
   forming a stack comprising:
      a first electrically-conductive layer formed on the insulating substrate;
      a semiconductor layer comprising a first semiconductor layer for absorbing a predetermined electromagnetic radiation, formed on the first conductive layer, and a second semiconductor layer forming a junction with the first semiconductor absorption layer and formed thereon; and
      a second electrically-conductive layer at least partly transparent to said radiation, formed on the semiconductor layer;
   forming at least one connection area dividing the stack into a first and a second electrically-adjacent photovoltaic cells only connected by an electric path between a portion of the first conductive layer of the first cell and a portion of the second conductive layer of the second cell,
   wherein the forming of said electric path comprises:
      forming a first trench in the stack from the second conductive layer to the substrate;
      forming a second trench separate from the first trench, from the second conductive layer to the first conductive layer; and
      depositing a conductive solution on an area of the second semiconductor layer comprising the first trench and at least a portion of the second trench located on a side of the first trench, the geometry of the trenches, the thickness of the second conductive layer, and the quantity and the properties of the conductive solution on deposition thereof being selected so that the conductive solution does not penetrate into the first trench all the way to the first conductive layer and penetrates into the second trench all the way to the first conductive layer.

2. The photovoltaic module manufacturing method of claim 1, wherein the solution does not penetrate into the first trench all the way to the absorption layer.

3. The photovoltaic module manufacturing method of claim 1, wherein the forming of the connection area comprises forming a third trench in the stack, only adjacent to the second trench and distinct therefrom, from the second conductive layer to the first conductive layer.

4. The photovoltaic module manufacturing method of claim 1, wherein the width of the second trench is selected so that the conductive solution is not in contact with the portion of the second semiconductor layer of the second cell.

5. The photovoltaic module manufacturing method of claim 1, wherein the widths of the first and second trenches are selected according to the viscosity of the conductive solution.

6. The photovoltaic module manufacturing method of claim 5, wherein the minimum lateral distance without matter in the first trench is selected according to the viscosity of the conductive solution.

7. The photovoltaic module manufacturing method of claim 1, wherein it comprises a step of texturing walls of the first trench with three-dimensional patterns.

8. The photovoltaic module manufacturing method of claim 7, wherein it comprises forming a periodic three-dimensional pattern comprising raised portions and recessed portions on a first wall of the first trench, and forming the same periodic pattern on a second wall of the first trench, opposite to the first wall, the pattern of the second wall being shifted with respect to the pattern of the first wall to have the raised portions of the pattern of the first wall face the hollow portions of the pattern of the second wall.

9. The photovoltaic module manufacturing method of claim 1, wherein it comprises a step of forming pads on a surface of the substrate exposed by the forming of the first trench, the height of the pads being substantially equal to that of the first trench.

10. The photovoltaic module manufacturing method of claim 1, wherein the volume of conductive solution in the first trench is smaller than the volume of conductive solution in the second trench.

11. The photovoltaic module manufacturing method of claim 1, wherein the deposition of the conductive solution is performed by screen printing or heliography.

* * * * *